(12) United States Patent
Marcus et al.

(10) Patent No.: US 8,445,818 B2
(45) Date of Patent: May 21, 2013

(54) PCB QUICK HEATER

(75) Inventors: Sean Marcus, Youngsville, NC (US); Jean-Philippe C. Lamantia, Raleigh, NC (US)

(73) Assignee: Sierra Wireless, Inc., Richmond, British Columbia (CA)

( * ) Notice: Subject to any disclaimer, the term of this patent is extended or adjusted under 35 U.S.C. 154(b) by 1051 days.

(21) Appl. No.: 12/435,517

(22) Filed: May 5, 2009

(65) Prior Publication Data

US 2010/0282730 A1    Nov. 11, 2010

(51) Int. Cl.
*H05B 11/00* (2006.01)
*H05K 1/00* (2006.01)

(52) U.S. Cl.
USPC .......................................... 219/209; 361/748

(58) Field of Classification Search
USPC ................ 219/209, 543, 544, 546–548, 483, 219/486, 497, 509–511; 361/717–720, 748–751
See application file for complete search history.

(56) References Cited

U.S. PATENT DOCUMENTS

| | | | |
|---|---|---|---|
| 6,590,188 B2 * | 7/2003 | Cline et al. | 219/497 |
| 6,621,055 B2 * | 9/2003 | Weber et al. | 219/494 |
| 6,841,739 B2 * | 1/2005 | Moore | 174/255 |
| 7,079,972 B1 * | 7/2006 | Wood et al. | 702/117 |
| 7,109,440 B2 * | 9/2006 | Lee | 219/216 |
| 2009/0086790 A1 | 4/2009 | Sosedov | |

FOREIGN PATENT DOCUMENTS

| | | |
|---|---|---|
| EP | 0514873 A | 11/1992 |
| GB | 2330289 A | 4/1999 |
| JP | 2006135186 A | 5/2006 |
| WO | 0128293 A | 4/2001 |

OTHER PUBLICATIONS

International Preliminary Report on Patentability in International Application No. PCT/US2009/048783, mailed Nov. 17, 2011.
International Search Report in International Application No. PCT/US2009/048783, mailed Sep. 23, 2009.

* cited by examiner

*Primary Examiner* — Sang Paik
(74) *Attorney, Agent, or Firm* — Nixon Peabody LLP

(57) ABSTRACT

Disclosed is a device and method for intelligently heating a component of a printed circuit board (PCB) to bring it within a specified operating temperature range quickly. A temperature sensor positioned in proximity to the component and is coupled with a logic circuit that receives a reading from the temperature sensor and compares it to a threshold temperature value. A heating element positioned in proximity to the component is coupled with a power source and a switch. The switch is triggered by the logic circuit to activate the heating element when the temperature sensor reading is cooler than the threshold temperature value thereby causing the component to warm up. The switch is triggered again by the logic circuit to de-activate the heating element when the temperature sensor reaches the threshold temperature value or a predetermined timeout period expires.

12 Claims, 4 Drawing Sheets

(a)          (b)

PCB QUICK HEATER

BACKGROUND

Mobile to mobile communication devices are being deployed in more extreme environments all the time. Small RF devices that are used for communication and data exchange purposes can be strategically deployed in warehouses, trucks, ships, shipping containers, and a variety of other outdoor environments. These devices must be able to operate over a wide variety of temperature conditions including extreme cold. If the RF device's components can not warm up in a timely manner, mission critical communications can be lost or delayed.

What is needed is a device for providing an intelligent localized heat source for specific circuit components that need to be within a specific temperature operating range to function properly.

SUMMARY

Disclosed is a device for intelligently heating a component of a printed circuit board (PCB) to bring it within a specified operating temperature range quickly. A temperature sensor positioned in proximity to the component and is coupled with a logic circuit that receives a reading from the temperature sensor and compares it to a threshold temperature value. A heating element positioned in proximity to the component is coupled with a power source and a switch. The switch is triggered by the logic circuit to activate the heating element when the temperature sensor reading is cooler than the threshold temperature value thereby causing the component to warm up. The switch is triggered again by the logic circuit to de-activate the heating element when the temperature sensor reaches a second warmer threshold temperature value or when a predetermined timeout period expires. The logic circuit can be implemented in hardware or software or a combination of hardware and software.

Also disclosed is a method of intelligently heating a component of a printed circuit board (PCB) to bring it within a specified operating temperature range quickly. The component is monitored to determine its temperature. The temperature reading is associated with the component and forwarded to a logic circuit for processing. The logic circuit compares the temperature reading to a threshold temperature value and triggers a switch to activate a heating element in proximity to the component when the temperature reading is cooler than the threshold temperature value. This causes the component to warm up. The logic circuit also de-activates the heating element when the temperature reading reaches the threshold temperature value or when a predetermined timeout period expires. The logic circuit can be implemented in hardware or software or a combination of hardware and software.

DETAILED DESCRIPTION OF THE INVENTION

On a typical printed circuit board (PCB) there may be several components that cannot function at low temperatures (e.g., −30° C. or colder). These components, however, are utilized by devices that may encounter environmental conditions that routinely experience 'out of range' temperature conditions. In such cases, the performance of the devices suffers, sometimes to the point of being inoperable. The embodiments of the present invention described herein address such situations by applying an intelligent localized heat source to selected components prior to operating the main device so as to avoid damaging the component or other components of the overall device.

Figure 1:
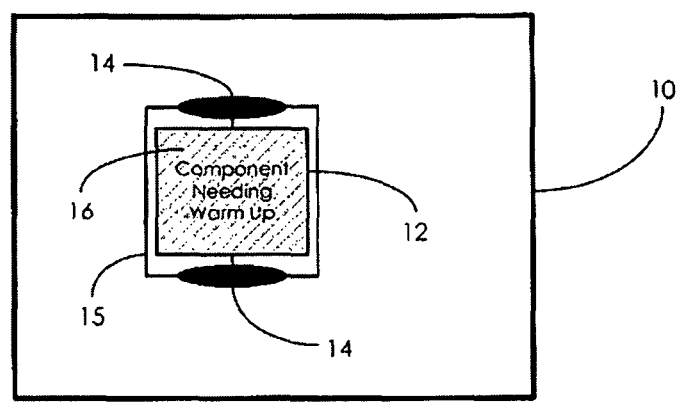
FIG. 1 is a top view illustration of one embodiment of a typical printed circuit board (PCB) that can be found within an RF module showing components utilized in the embodiments of the invention.

FIG. 1 is a top view illustration of one embodiment of a typical printed circuit board (PCB) 10 that can be found within an RF module (not pictured) of an overall main device showing components utilized in the embodiments of the present invention. The PCB 10 has been simplified to illustrate just a single component 12 that is associated with a heat source or heating element 16 that sits atop the component 12. Pads 14 provide contact points that can relay power to the heating element 16 via a flexible PCB substrate 15. The flexible PCB substrate 15 can be configured to cover the component 12 needing heat.

Figure 2:
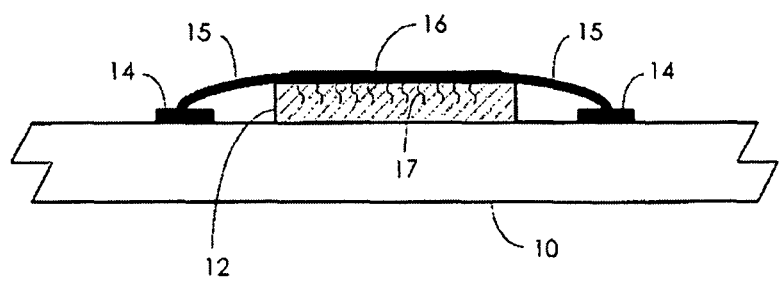
FIG. 2 is a side view illustration of FIG. 1.

FIG. 2 is a side view illustration of FIG. 1. This illustration shows the base PCB 10 having pads 14 on either side of the component 12 that needs heating. The flexible PCB 15 with an embedded heating element 16 is shown atop the component 12 radiating 17 heat into the component. There are other components to the heating system that have not yet been illustrated including a temperature sensor, some logic or intelligence, and a switch mechanism for engaging and disengaging the heating element 16.

Figure 3:
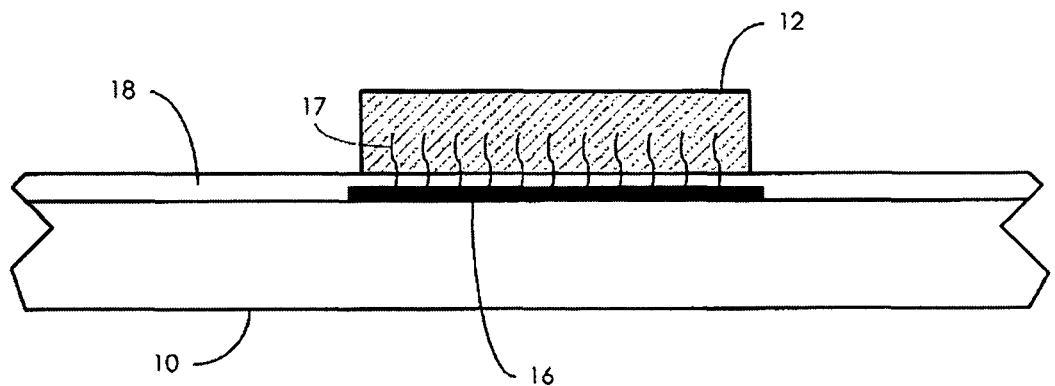
FIG. 3 is a side view illustration of another embodiment of a typical printed circuit board (PCB) that can be found within an RF module showing components utilized in the embodiments of the invention.

FIG. 3 is a side view illustration of another embodiment of a typical printed circuit board (PCB) 10 that can be found within an RF module showing components utilized in the embodiments of the invention. In this embodiment the base PCB 10 includes a heat layer 18. Within the heat layer 18, one or more heating elements 16 are dispersed. In this illustration, a component 12 that may need heating is positioned atop the heating element 16 which can radiate 17 heat upward into the component 12.

Figure 4:
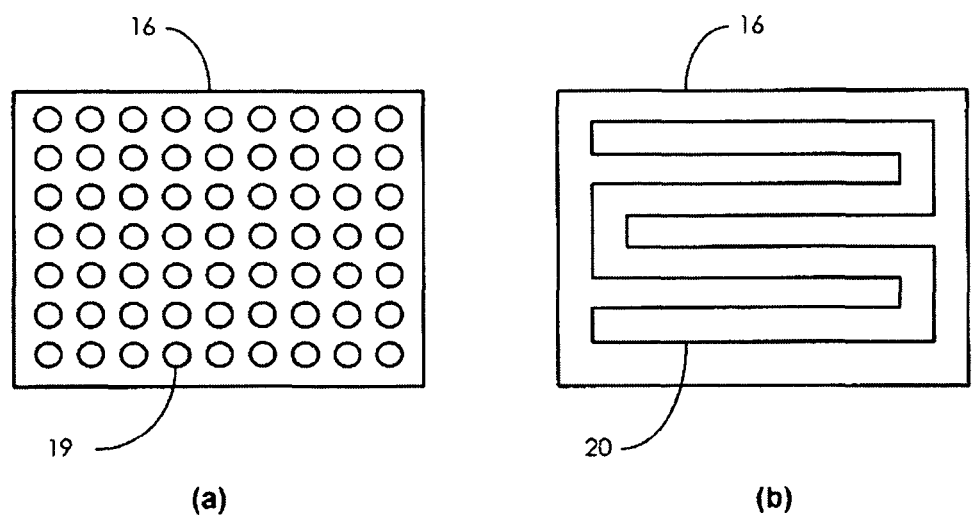
FIG. 4 is an illustration of different embodiments of a heating element.

FIG. 4 illustrates examples of heating elements 16 that can be used with the embodiments presented above. FIG. 4(a) illustrates a heating element 16 comprised of a resistive element having a plurality of perforations 19 to assist with heat flow. FIG. 4(b) illustrates a heating element 16 comprised of a resistive element 20 arranged in a pattern and embedded with a substrate. The actual pattern can vary and need not be confined to that shown in FIG. 4(b). The resistive element itself can be metallic or made from a material such as, but not limited to, OhmegaPly® embedded resistive material.

Figure 5:
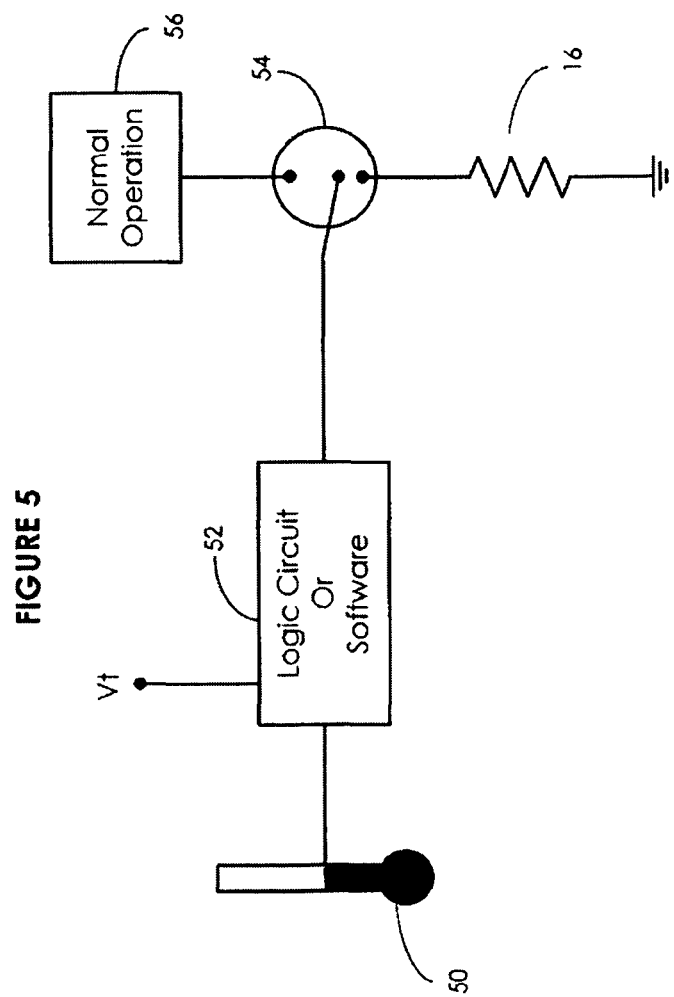
FIG. 5 is a block diagram that illustrates the operation of the device according to embodiments of the invention.

FIG. 5 is a block diagram that illustrates the operation of the device according to embodiments of the invention. A temperature sensor 50 is positioned on or about a specific PCB component that may need heating. The temperature sensor 50 monitors the ambient temperature for the component to which it is associated. The temperature reading is forwarded to a logic circuit (or software associated with a processor) 52 that determines whether the current temperature exceeds a predetermined threshold indicating the need to heat a component prior to operating the main device. If the temperature reading is below the threshold, a signal is sent that causes a switch 54 to trigger a heating element 16 that is placed in close proximity to the component that needs to be warmed up. If the temperature reading is below the threshold, a signal is sent that causes the switch 54 to close a circuit that causes normal operation 56 of the main device without involving the heating element. The temperature sensor 50 operates to continuously monitor the component temperature and will trigger the switch 54 accordingly when the temperature threshold is crossed in either direction.

Figure 6:
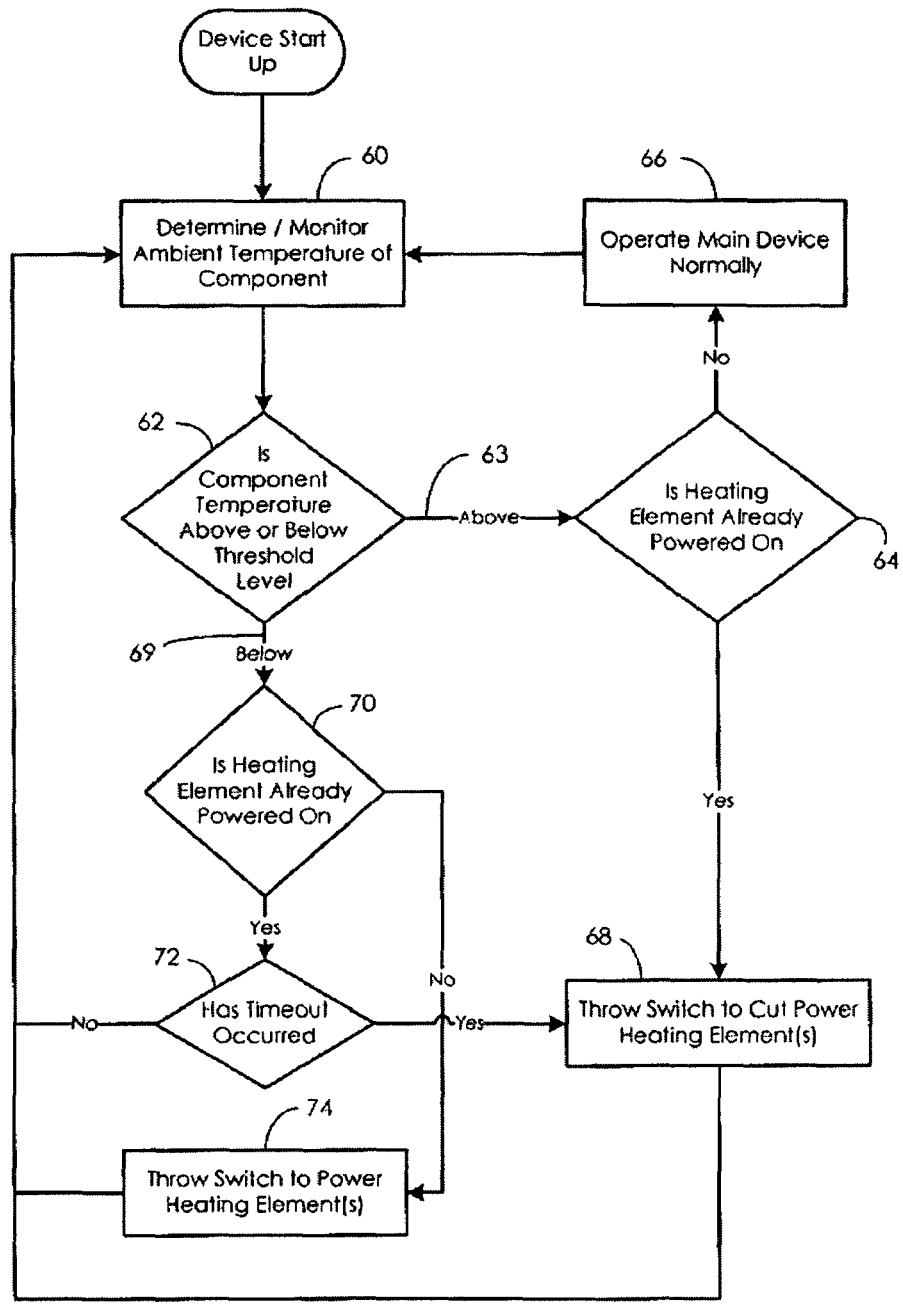
FIG. 6 is a logic diagram that illustrates the operation of the device according to embodiments of the invention.

FIG. 6 is a logic diagram that illustrates the operation of the device according to embodiments of the invention. When the overall main device is started up, it initially takes a temperature sensor reading of the ambient temperature on and about a specific component 60. If the temperature is determined 62 to be warmer than or above 63 a predetermined threshold via a logic circuit (or software), another check is made to determine whether the heating element is already powered on 64. If the result is no then the main device is operated normally 66 and control returns to the temperature monitoring process 60. If the heating element is already powered on then it is powered off 68 via the switch mechanism and control returns to the temperature monitoring process 60.

If the temperature is determined 62 to be cooler than or below 69 the predetermined threshold, it is also determined whether the heating element is already powered on 70. If the heating element is not already powered on then it is powered on 74 via the switch mechanism and control returns to the temperature monitoring process 60. If the heating element is already powered on then a determination is made whether a timeout has occurred 72 such that the heating element does not stay on for too long. If the timeout has not occurred yet control returns to the temperature monitoring process 60. If the timeout has occurred then the heating element is powered off 68 via the switch mechanism and control returns to the temperature monitoring process 60.

The component's temperature is continuously monitored such that the heating element(s) will power on and off as necessary to keep the component above the predetermined temperature threshold.

The present invention has described below with reference to flowchart illustrations and/or block diagrams of methods, and apparatus (systems). It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A system for heating a component of a first printed circuit board (PCB) comprising:
   a temperature sensor adapted to determine a temperature about the component;
   a logic circuit that receives a reading from the temperature sensor and compares it to a threshold temperature value; and
   a heating element positioned in proximity to the component and coupled with a power source and a switch,
   wherein the switch is triggered by the logic circuit to activate the heating element when the temperature is determined to be below the threshold temperature value thereby causing the component to warm up, and
   wherein the heating element is comprised of a resistive material embedded within a second, flexible printed circuit board (PCB) that substantially surrounds the component.

2. The system of claim 1 wherein the switch is triggered by the logic circuit to de-activate the heating element when the temperature sensor reaches the threshold temperature value.

3. The system of claim 1 wherein the switch is triggered by the logic circuit to de-activate the heating element when a predetermined timeout period expires.

4. A system for heating a component of a first printed circuit board (PCB) comprising:
- a temperature sensor adapted to determine a temperature about the component;
- software instructions that receive a reading from the temperature sensor and compares it to a threshold temperature value; and
- a heating element positioned in proximity to the component and coupled with a power source and a switch,
- wherein the switch is triggered by the software instructions to activate the heating element when the temperature is determined to be below the threshold temperature value thereby causing the component to warm up, and
- wherein the heating element is comprised of a resistive material embedded within a second, flexible printed circuit board (PCB) that substantially surrounds the component.

5. The system of claim 4 wherein the switch is triggered by the software instructions to de-activate the heating element when the temperature sensor reaches the threshold temperature value.

6. The system of claim 4 wherein the switch is triggered by the software instructions to de-activate the heating element when a predetermined timeout period expires.

7. A method of heating a component of a first printed circuit board (PCB) comprising:
- monitoring the component to determine its temperature;
- forwarding a temperature reading associated with the component to a logic circuit for processing wherein the logic circuit:
  - compares the temperature reading to a threshold temperature value; and
  - triggers a switch to activate a heating element in proximity to the component when the temperature reading is determined to be below the threshold temperature value thereby causing the component to warm up, wherein the heating element is comprised of a resistive material embedded within a second, flexible printed circuit board (PCB) that substantially surrounds the component.

8. The method of claim 7 further comprising de-activating the heating element when the temperature reading reaches the threshold temperature value.

9. The method of claim 7 further comprising de-activating the heating element when a predetermined timeout period expires.

10. A method of heating a component of a first printed circuit board (PCB) comprising:
- monitoring the component to determine its temperature;
- forwarding a temperature reading associated with the component to a software component for processing wherein the software component:
  - compares the temperature reading to a threshold temperature value; and
  - triggers a switch to activate a heating element in proximity to the component when the temperature reading is determined to be below the threshold temperature value thereby causing the component to warm up, wherein the heating element is comprised of a resistive material embedded within a second, flexible printed circuit board (PCB) that substantially surrounds the component.

11. The method of claim 10 further comprising de-activating the heating element when the temperature reading reaches the threshold temperature value.

12. The method of claim 10 further comprising de-activating the heating element when a predetermined timeout period expires.

* * * * *